US006861739B1

(12) United States Patent
Bhavnagarwala et al.

(10) Patent No.: US 6,861,739 B1
(45) Date of Patent: Mar. 1, 2005

(54) MINIMUM METAL CONSUMPTION POWER DISTRIBUTION NETWORK ON A BONDED DIE

(75) Inventors: Azeez J. Bhavnagarwala, Atlanta, GA (US); Ashok K. Kapoor, Palo Alto, CA (US)

(73) Assignee: LSI Logic Corporation, Milpitas, CA (US)

( * ) Notice: Subject to any disclaimer, the term of this patent is extended or adjusted under 35 U.S.C. 154(b) by 24 days.

(21) Appl. No.: 09/858,686

(22) Filed: May 15, 2001

(51) Int. Cl.[7] .............................................. H01L 23/58
(52) U.S. Cl. ...................................... 257/691; 257/723
(58) Field of Search ................................ 257/500, 502, 257/691, 723, 724, 786; 361/777, 780, 794; 323/311, 313, 314, 349, 350, 351; 327/565; 326/101; 307/42

(56) References Cited

U.S. PATENT DOCUMENTS 3,866,066 A * 2/1975 Pedersen ..................... 327/530
4,779,161 A * 10/1988 DeShazo, Jr. ............... 361/106
5,939,780 A * 8/1999 Inoue ......................... 257/692
2002/0167080 A1 * 11/2002 Barber et al. ............... 257/685

* cited by examiner

Primary Examiner—John B. Vigushin
(74) Attorney, Agent, or Firm—Fitch, Even, Tabin & Flannery

(57) ABSTRACT

A method for minimum metal consumption power distribution includes the steps of forming a circuit having a plurality of circuit components on an electrically insulated substrate and forming a plurality of supply voltage regulators on the electrically insulating substrate wherein each of the plurality of supply voltage regulators is located adjacent to each of the plurality of circuit components respectively, and each of the plurality of supply voltage regulators is connected to each of the plurality of circuit components respectively for generating a regulated voltage rail output to each of the plurality of circuit components respectively.

24 Claims, 2 Drawing Sheets

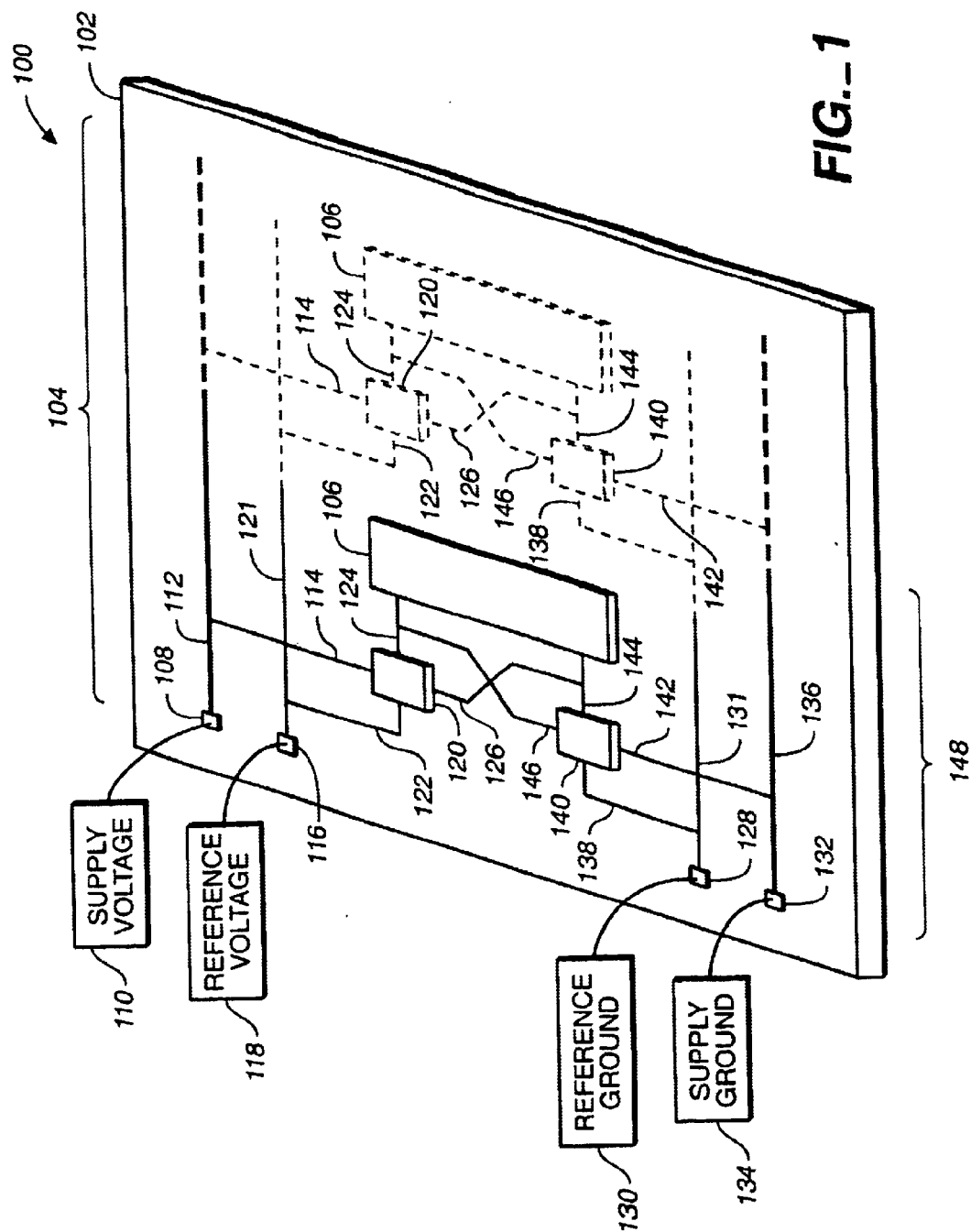
FIG._1

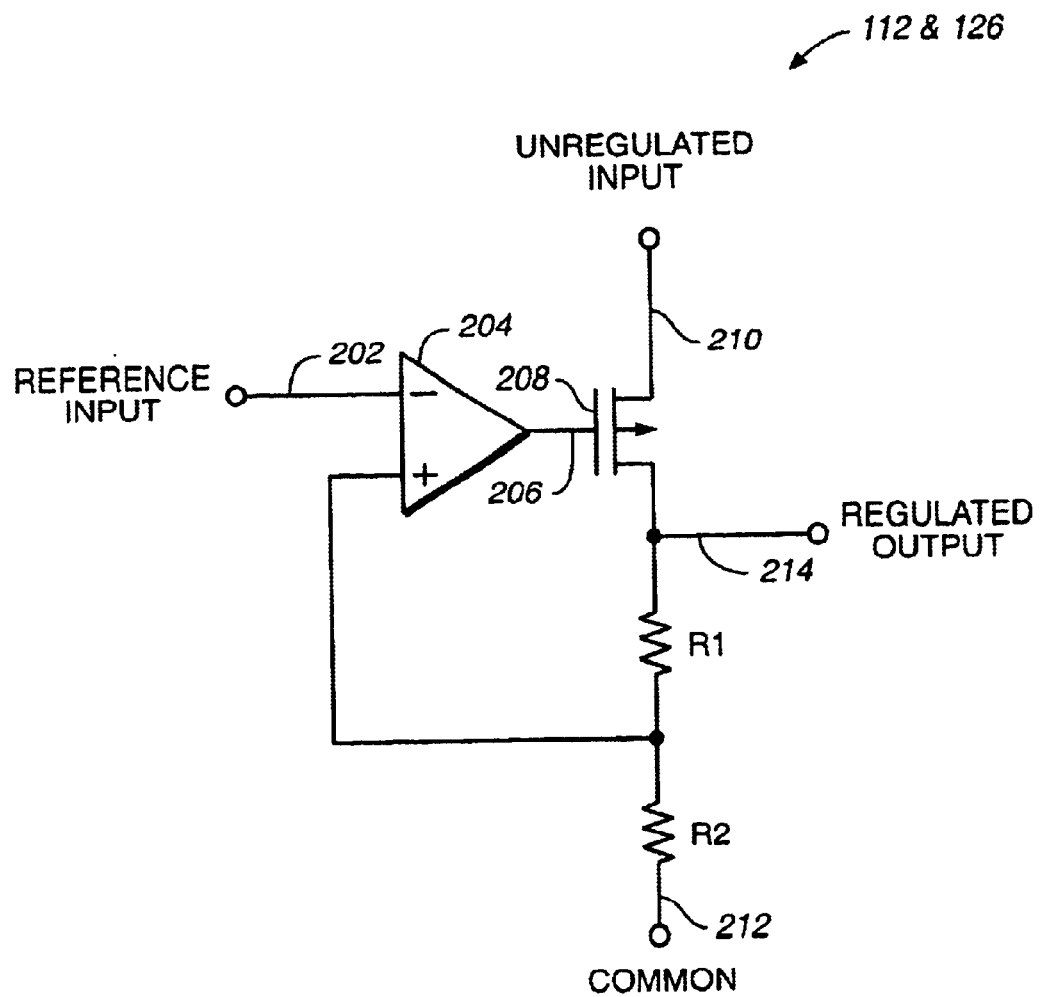
FIG._2

US 6,861,739 B1

MINIMUM METAL CONSUMPTION POWER DISTRIBUTION NETWORK ON A BONDED DIE

BACKGROUND OF THE INVENTION

The present invention relates generally to power regulation. More specifically, but without limitation thereto, the present invention relates to regulating power in integrated circuits having circuit components connected to power buses by conductors subject to significant voltage drops.

In a conventional method for distributing power across a low-cost peripherally bonded chip, power and ground are connected to bond pads located along the four edges of the die and then routed horizontally on metal buses to the remainder of the chip. The power and ground pads are typically tied orthogonally to global metal buses that are part of power and ground rings circling the outside of the chip to provide separate supplies for the I/O pads and to tie together common supply pads. Typically there are more than two supply rings to provide separate supplies for the I/O pads and circuit components on the inside of the chip. The supply rings are connected to a set of alternating power and ground buses that carry power across the chip. These buses use a substantial fraction of the area of the top metal layer to maintain IR drops (voltage drops due to current flowing through the bus resistance) within a few percent of the voltage rail. The remaining area of the top metal layer between the buses is left for wiring tracks for global signals such as the clock signal. The global power buses feed a set of local power buses that carry power to circuit components inside the chip circuit.

With scaling of minimum feature size and accompanying increases in transistor count, the interconnect wire current densities and resistance per unit length increase due to shrinking cross-sections. These effects are especially pronounced in the power distribution network of scaled supply voltages, increasing chip currents, and increasing chip size, where IR drops become a larger fraction of the supply voltage. The increased IR drops limit performance characteristics and may also cause logic failures. As IR drops across power and ground pads become larger fractions of the supply voltage, the I/O counts for the peripherally bonded chip power supply are determined by the maximum IR drop that may be tolerated along the pad. The Process Integration and Devices section of the 1997 National Technology Roadmap for Semiconductors (NTRS) warns that metal consumption by power, ground, and clock distribution networks will increase with scaling. The dependency of size and cycle time performance of wire limited logic chips on the wiring area requirements of the chip translates directly into longer cycle time, larger chip area, and higher chip and system cost.

SUMMARY OF THE INVENTION

The present invention advantageously addresses the needs above as well as other needs by providing a method and apparatus for minimum metal consumption power distribution.

In one embodiment, the invention may be characterized as a method for minimum metal consumption power distribution on a bonded die that includes the steps of forming a circuit having a plurality of circuit components on an electrically insulated substrate and forming a plurality of supply voltage regulators on the electrically insulating substrate wherein each of the plurality of supply voltage regulators is located adjacent to each of the plurality of circuit components respectively, and each of the plurality of supply voltage regulators is connected to each of the plurality of circuit components respectively for generating a regulated voltage rail output to each of the plurality of circuit components respectively.

In another embodiment, the invention may be characterized as an apparatus for minimum metal consumption power distribution on a bonded die that includes a circuit comprising a plurality of circuit components formed on an electrically insulated substrate and a plurality of supply voltage regulators formed on the electrically insulating substrate wherein each of the plurality of supply voltage regulators is located adjacent to each of the plurality of circuit components respectively, and each of the plurality of supply voltage regulators is connected to each of the plurality of circuit components respectively for generating a regulated voltage rail output to each of the plurality of circuit components respectively.

The features and advantages summarized above in addition to other aspects of the present invention will become more apparent from the description, presented in conjunction with the following drawings.

BRIEF DESCRIPTION OF THE DRAWINGS

The above and other aspects, features and advantages of the present invention will be more apparent from the following more specific description thereof, presented in conjunction with the following drawings wherein:

FIG. 1 is a diagram of a power distribution network for minimum metal consumption on a bonded die according to an embodiment of the present invention; and FIG. 2 is a schematic diagram of an exemplary voltage regulator suitable for the voltage regulators in the power distribution network of FIG. 1.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

FIG. 1 is a diagram of a power distribution network 100 for minimum metal consumption on a bonded die. Shown are an electrically insulated substrate 102, a circuit 104, circuit components 106, a supply voltage contact 108, a supply voltage source 110, a power conductor 112, unregulated inputs 114 and 142, a reference voltage contact 116, a reference voltage source 118, supply voltage regulators 120, a reference voltage conductor 121, reference inputs 122 and 138, voltage rail outputs 124, supply voltage regulator commons 126, a reference ground contact 128, a reference ground source 130, a reference ground conductor 131, a supply ground contact 132, a supply ground source 134, a return conductor 136, return voltage regulators 140, supply ground inputs 142, ground rail outputs 144, return voltage regulator commons 146, and a locally regulated segment 148.

The electrically insulated substrate 102 may be, for example, the substrate of a bonded die made according to techniques well known in the art of microelectronics. The circuit 104 may be a circuit of a processed wafer formed on the electrically insulated substrate 102. The circuit 104 includes several circuit components 106, such as transistors used in logic elements that require a voltage and ground rails. Only two circuit components 106 are shown in a single circuit 104 for clarity, however, a bonded die may include thousands of circuits 104 each including hundreds of circuit components 106. Also, one or more of the circuit components 106 may be a local circuit that includes several circuit components. The locally regulated segment 148 may be replicated for each component 106 in the circuit 104, although the circuit components 106 may differ from one another, and there may be many different circuits 104 on a single bonded die.

The circuit components 106, the supply voltage contact 108, the power conductor 112, the reference voltage contact 116, the reference voltage conductor 121, the reference ground contact 128, the reference ground conductor 131, the supply ground contact 132, and the return conductor 136 are formed on the electrically insulated substrate 102 according to well known techniques. The reference voltage contact 116 is connected to the reference voltage source 118. The reference voltage source 118 should be well regulated to provide a stable, noise free voltage but does not have to provide significant current. The supply voltage contact 108 is connected to the supply voltage source 110. The supply voltage source 110 may be any power source appropriate for providing the required power to all of the circuit components 106. The power conductor 112 connects the supply voltage contact 108 to the supply voltage regulators 120.

The reference ground contact 128 is connected to the reference ground source 130. The reference ground source 130 should be well regulated to provide a stable, noise free ground but does not have to sink significant current. The supply ground contact 132 is connected to the supply ground source 134. The supply ground source 134 may be any power source appropriate for providing the required power return to all the circuit components 106. The return conductor 136 connects the supply ground contact 132 to the return voltage regulators 140. The dashed lines indicate that each locally regulated segment 148 may be repeated for each component 106 of the circuit 104 on the substrate 102. Although each component 106 may use the same voltage, each component 106 may differ from another.

In the power distribution network 100, the voltage regulators 120 maintain the voltage rails 124 for the circuit components 106 inside the circuit 104 while tolerating an IR drop resulting from reduced metal consumption associated with the power conductor 112. The IR drop occurs over the length of the power conductor 112 between the voltage supply contact 108 located outside the circuit 104 and the voltage regulators 120 located at each component 106 inside the circuit 104. Each voltage regulator 120 is connected to the reference voltage contact 116 to input a clean reference voltage without drawing significant current and regulates the supply voltage that is subject to IR drop and electrical noise. Each voltage regulator maintains its output voltage close to the reference voltage substantially independent of the IR drops over the power and return conductors. Because the IR drop along a global bus increases linearly with the resistance of the bus, reduction of global metal widths by a metal reduction factor increases the IR drop of the power and return conductors by the same factor. By boosting the off-chip supply voltage level by the metal reduction factor multiplied by the IR drop, the metal consumed by the power buses may be correspondingly reduced while still maintaining the rail voltage at each point of power distribution. For example, boosting the supply voltage by five times the typically tolerated IR drop of three percent, i.e., a metal reduction factor of 15 percent, would permit reducing the power bus width to one-fifth of the normal width. This can reduce metal consumption by 80 percent. Conductors in which the metal has been reduced to conserve metal are referred to herein as minimum metal conductors.

In operation, a reference voltage ($V_{REF}$) is input from the reference voltage source 118 to the reference voltage contact 116 and routed by the reference voltage conductor 121 to the reference inputs 122 of the supply voltage regulators 120. Because no significant current is drawn from the reference voltage source 118, there is no IR drop from the reference voltage contact 116 to the supply voltage regulators 120. A supply voltage ($V_S$) equal to the reference voltage multiplied or boosted by a voltage overhead factor is input to the supply voltage contact 108 and routed by the power conductor 112 to the unregulated inputs 114 of the supply voltage regulators 120. The voltage overhead factor is selected to accommodate the IR drop from the supply voltage contact 108 to the supply voltage regulators 120 plus the voltage margin required to operate the supply voltage regulators 120. Multiplying the voltage overhead factor by the reference voltage indicates the required supply voltage. For example, if the voltage overhead factor is 1.15, a reference voltage of 12 V would indicate a required supply voltage of 13.80 V. The IR drop thus corresponds to the difference between the supply voltage at the supply voltage contact 108 and the voltage rail ($V_{RAIL}$) 124 output from the supply voltage regulators 120 to each of the circuit components 106 respectively. The supply voltage regulator commons 126 of the supply voltage regulators 120 may be referenced to a global ground rail, however global ground rails are also subject to IR drops and electrical noise. A regulated ground rail may be generated to more precisely control $V_{RAIL}$ 124 to each of the circuit components 106 as follows.

A reference ground ($G_{REF}$) is input from the reference ground source 130 to the reference ground contact 128 and is routed by the reference ground conductor 131 to the reference inputs 138 of return voltage regulators 140. Because no significant current is drawn from the reference ground source 130, there is no IR drop from the reference ground contact 128 to the return voltage regulators 140. A supply ground (Gs) from the supply ground source 134 equal to the reference voltage multiplied or boosted by a ground overhead factor is input to the supply ground contact 132 and routed by the supply ground conductor 136 to the unregulated inputs 142 of return voltage regulators 140. The ground overhead factor includes a polarity reversal and is selected to accommodate the IR drop from the supply ground contact 132 to the supply ground regulators 140 plus the voltage margin required to operate the supply ground regulators 140. Multiplying the ground overhead factor by the reference voltage indicates the required voltage for the supply ground. For example, if the ground overhead factor is –0.15, a reference voltage of 12 V would indicate a required voltage for the supply ground of –1.80 V. The IR drop thus corresponds to the difference between the supply ground ($G_S$) at the supply ground contact 132 and the ground rail ($G_{RAIL}$) 144 output from the supply ground regulators 140 to each of the circuit components 106 respectively. In this example, the return voltage regulator commons 146 are connected to the $V_{RAIL}$ outputs 124 and the supply voltage regulator commons 126 are connected to the $G_{RAIL}$ outputs 144. Other arrangements for connecting various types of voltage regulators formed on the substrate 102 next to each of the circuit components 106 may be used according to well known techniques.

FIG. 2 is a schematic of an exemplary voltage regulator suitable for the voltage regulators 120 and 140 in the power distribution network 100 of FIG. 1. The reference input 202 couples either the reference voltage or the reference ground to the inverting input of the operational amplifier 204. The output 206 of the operational amplifier 204 controls the current flowing through the field-effect transistor (FET) 208. FET 208 conducts current from the unregulated input 210 through the resistors R1 and R2 to the regulator common 212 to maintain the regulated output 214. The ratio of the resistance values of R1 and R2 is selected to feed back an appropriate voltage to the operational amplifier 204 for maintaining the regulated output 214 equal to the voltage at the reference input 202 according to well known techniques.

Other modifications, variations, and arrangements of the present invention may be made in accordance with the above teachings other than as specifically described to practice the invention within the spirit and scope defined by the following claims.

What is claimed is:

1. A method for minimum metal consumption power distribution on a bonded die comprising the following steps:
    forming a circuit having a plurality of circuit components on an electrically insulated substrate; and
    forming a plurality of supply voltage regulators on the electrically insulating substrate wherein:
        each of the plurality of supply voltage regulators is located adjacent to each of the plurality of circuit components respectively, and
        each of the plurality of supply voltage regulators is connected to each of the plurality of circuit components respectively for generating a regulated voltage rail output to each of the plurality of circuit components respectively.

2. The method of claim 1 further comprising the step of forming a power conductor on the electrically insulating substrate for connecting each of the plurality of supply voltage regulators to a supply voltage.

3. The method of claim 2 wherein the supply voltage has a magnitude greater than a sum of the reference voltage plus an IR voltage drop of the power conductor.

4. The method of claim 1 wherein the circuit and the electrically insulating substrate constitute a bonded die.

5. The method of claim 1 wherein at least one of the plurality of circuit components comprises a transistor.

6. The method of claim 1 wherein at least one of the plurality of circuit components comprises a local circuit.

7. The method of claim 1 further comprising the step of forming a plurality of return voltage regulators on the electrically insulating substrate wherein:
    each of the plurality of return voltage regulators is located adjacent to each of the plurality of circuit components respectively, and
    each of the plurality of return voltage regulators is connected to each of the plurality of circuit components respectively for generating a regulated ground rail output to each of the plurality of circuit components respectively.

8. The method of claim 1 further comprising the step of forming a return conductor on the electrically insulating substrate for connecting each of the plurality of return voltage regulators to a supply ground.

9. The method of claim 8 wherein the supply ground has a polarity opposite that of the reference voltage and has a magnitude greater than an IR voltage drop of the return conductor.

10. The method of claim 8 further comprising the step of connecting at least one of the plurality of return voltage regulators to the voltage rail output for regulating the supply ground.

11. The method of claim 10 further comprising the step of connecting at least one of the plurality of supply voltage regulators to the ground rail output for regulating the supply voltage.

12. The method of claim 1 wherein at least one of the power conductor and the return conductor is a minimum metal conductor.

13. An apparatus for minimum metal consumption power distribution on a bonded die comprising:
    a circuit comprising a plurality of circuit components formed on an electrically insulated substrate; and
    a plurality of supply voltage regulators formed on the electrically insulating substrate wherein:
        each of the plurality of supply voltage regulators is located adjacent to each of the plurality of circuit components respectively, and
    a plurality of supply voltage regulators formed on the electrically insulating substrate wherein:
        each of the plurality of supply voltage regulators is located adjacent to each of the plurality of circuit components respectively, and
        each of the plurality of supply voltage regulators is connected to each of the plurality of circuit components respectively for generating a regulated voltage rail output to each of the plurality of circuit components respectively.

14. The apparatus of claim 13 further comprising a power conductor formed on the electrically insulating substrate for connecting each of the plurality of supply voltage regulators to a supply voltage.

15. The apparatus of claim 14 wherein the supply voltage has a magnitude greater than a sum of the reference voltage plus an IR voltage drop of the power conductor.

16. The apparatus of claim 13 wherein the circuit and the electrically insulating substrate constitute a bonded die.

17. The apparatus of claim 13 wherein at least one of the plurality of circuit components comprises a transistor.

18. The apparatus of claim 13 wherein at least one of the plurality of circuit components comprises a local circuit.

19. The apparatus of claim 13 further comprising a plurality of return voltage regulators formed on the electrically insulating substrate wherein:
    each of the plurality of return voltage regulators is located adjacent to each of the plurality of circuit components respectively, and
    each of the plurality of return voltage regulators is connected to each of the plurality of circuit components respectively for generating a regulated ground rail output to each of the plurality of circuit components respectively.

20. The apparatus of claim 19 further comprising a return conductor formed on the electrically insulating substrate for connecting each of the plurality of return voltage regulators to a supply ground.

21. The apparatus of claim 20 wherein the supply ground has a polarity opposite that of the reference voltage and has a magnitude greater than an IR voltage drop of the return conductor.

22. The apparatus of claim 19 wherein at least one of the plurality of return voltage regulators is connected to the voltage rail output for regulating the supply ground.

23. The apparatus of claim 22 further wherein at least one of the plurality of supply voltage regulators is connected to the ground rail output for regulating the supply voltage.

24. The apparatus of claim 19 wherein at least one of the power conductor and the return conductor is a minimum metal conductor.

* * * * *